(12) United States Patent
Richter (10) Patent No.: US 8,951,886 B2
(45) Date of Patent: Feb. 10, 2015

(54) METHOD FOR SEPARATING A LAYER SYSTEM COMPRISING A WAFER BY PRECISELY MAINTAINING THE POSITION OF THE SEPARATING FRONT

(75) Inventor: Franz Richter, Eichenau (DE)

(73) Assignee: Thin Materials AG, Eichenau (DE)

( * ) Notice: Subject to any disclaimer, the term of this patent is extended or adjusted under 35 U.S.C. 154(b) by 30 days.

(21) Appl. No.: 13/141,470

(22) PCT Filed: Dec. 23, 2009

(86) PCT No.: PCT/EP2009/067893
§ 371 (c)(1),
(2), (4) Date: Oct. 10, 2011

(87) PCT Pub. No.: WO2010/072826
PCT Pub. Date: Jul. 1, 2010

(65) Prior Publication Data
US 2012/0028438 A1    Feb. 2, 2012

(30) Foreign Application Priority Data

Dec. 23, 2008 (DE) .......................... 10 2008 055 155
Jan. 29, 2009 (EP) ...................................... 09151661

(51) Int. Cl.
*H01L 21/46*    (2006.01)
*H01L 21/322*   (2006.01)
*H01L 21/683*   (2006.01)

(52) U.S. Cl.
CPC ........ *H01L 21/6835* (2013.01); *H01L 21/6836* (2013.01); *H01L 2221/68318* (2013.01); *H01L 2221/68327* (2013.01); *H01L 2221/68386* (2013.01); *H01L 2221/6839* (2013.01)
USPC ........... 438/458; 438/459; 438/464; 438/471; 438/472

(58) Field of Classification Search
USPC .......................... 438/458, 459, 464, 471, 472
See application file for complete search history.

(56) References Cited

U.S. PATENT DOCUMENTS

| 5,447,596 A | 9/1995 | Hayase |
| 6,342,434 B1 | 1/2002 | Miyamoto et al. |
| 2003/0000635 A1 | 1/2003 | Anker |
| 2003/0077854 A1 | 4/2003 | Teshirogi et al. |
| 2004/0168764 A1 | 9/2004 | Anker |
| 2005/0032332 A1 | 2/2005 | Miyamoto et al. |

FOREIGN PATENT DOCUMENTS

| CN | 1243327 | 2/2000 |
| CN | 1272682 | 11/2000 |
| CN | 1606132 | 4/2005 |
| CN | 1609158 | 4/2005 |
| CN | 101104781 | 1/2008 |
| JP | 2006032506 | 2/2006 |
| WO | 2004/051708 A2 | 6/2004 |
| WO | 2007/099146 A1 | 9/2007 |

*Primary Examiner* — Thanh V Pham
(74) *Attorney, Agent, or Firm* — Duane Morris LLP; J. Rodman Steele, Jr.; Gregory M. Lefkowitz (57) ABSTRACT

A method for mechanically separating a laminar structure from a first carrier assembly, comprising or consisting of a first carrier, wherein the laminar structure comprises a wafer and a second, stretchable carrier is disclosed. Also disclosed are the use of a particular separating aid for separating a laminar structure and a device for carrying out the method.

13 Claims, 4 Drawing Sheets

METHOD FOR SEPARATING A LAYER SYSTEM COMPRISING A WAFER BY PRECISELY MAINTAINING THE POSITION OF THE SEPARATING FRONT

CROSS-REFERENCE TO RELATED APPLICATIONS

This application is a §371 national stage entry of International Application No. PCT/EP2009/067893, filed Dec. 23, 2009, which claims priority to European Patent Application No. EP 09151661.7, filed Jan. 29, 2009, and German Patent Application No. DE 10 2008 055 155.4, filed Dec. 23, 2008, the entire contents of which are incorporated herein by reference.

FIELD OF THE INVENTION

The invention relates to a method for mechanically separating a laminar structure from a first carrier assembly, comprising or consisting of a first carrier, wherein the laminar structure comprises a wafer and optionally a second, stretchable carrier. It further relates to the use of a particular separating aid for separating a laminar structure and a device for carrying out the method according to the invention.

BACKGROUND OF THE INVENTION

In the semiconductor industry there is a constant demand for thinner and thinner components, or wafers from which these components are isolated. In the production and in particular in the thinning of wafers, laminar structure solutions are employed, for protecting and mechanically stabilizing the wafer that is to be thinned during the thinning process. These layer systems also perform the stated functions in subsequent processing steps. In particular, however, they serve to stabilize thinned wafers, which owing to their small thickness are particularly mechanically sensitive. Layer systems are used for this, comprising materials that are the most suitable for the particular purpose, e.g. films, other wafers or glass plates. These parts of the layer systems can in their turn be combined with wax, elastomers or other plastics.

If, in these layer systems, a glass plate or a disk with mechanical properties comparable to the wafer that is to be thinned—as naturally in particular another wafer possesses—is used as carrier, which in particular is to serve for stabilizing the complete layer system, it is advantageous and in some circumstances even necessary for a layer to be present between the surface to be protected and this carrier, said layer joining together the wafer to be processed and the carrier. This layer must on the one hand ensure sufficient adhesion between the carrier and the wafer to be processed, and on the other hand it must be able to even out the topographic irregularities that are usually present on the surface of the wafer to be processed. These topographic irregularities are caused for example by electronic components on the active side of the wafer, which of course must be protected during thinning, as well as for example by contacts such as bumps. The bonding layer can of course also be a layer system, comprising several different layers, which advantageously are complementary with respect to their properties, e.g. adhesion promoting, elasticity, hardness, thermal conductivity, chemical resistance etc. in the sense of the intended application.

In the production of very thin wafers, thinning imposes a high mechanical loading on the wafer that is to be thinned. As the wafer that is to be thinned has often already gone through a large number of manufacturing steps and in particular often already includes the electronic components on its active side (front), also from the economic standpoint it is extremely important that breakage of the wafer and therefore rejection are avoided as far as possible during thinning. For this purpose, before high mechanical loading occurs, while the wafer is still in the unthinned state it is bonded to the carrier. The back that is to be thinned (i.e. the side that does not comprise the electronic components) must of course remain free. Joining of the wafer to its carrier is also called bonding.

After bonding, the wafer is thinned on its back, as a result of which—as already mentioned—it loses mechanical stability. This is compensated by the carrier during thinning and subsequently. Accordingly, the carrier must provide a more stabilizing action, the thinner the wafer is at the end of the thinning process. Accordingly, in the case of relatively thick wafers as end product, films can also be used as carriers. Basically it is possible that, during thinning, the wafer is already separated into its individual components. In many cases this is desirable, as it makes a subsequent separating step unnecessary. Separating can for example be achieved by providing, on the active side of the wafer between the individual components (dice), depressions that are deep enough so that during the thinning of the backs, these depressions are already reached and therefore pass through.

The company DISCO HI-TEC offers a process, called "Dicing by Grinding", in which the wafer can, by means of thinning, also be separated. In this, structures are ground-in, scribed or etched on the front of the wafer before applying the carrier. These structures have a depth that is greater than the final thickness to which the wafer is thinned. Accordingly, as a result of thinning, as described above, the structures are opened and the wafer is thus separated.

As a result of separation, the overall risk of breakage is certainly reduced, but the separated components must in their turn be protected from mechanical loading.

There is always the problem in thinning that, after thinning, the carrier has to be separated from the wafer. In particular, the carrier must be separated because it blocks access to the electronic components on the active side of the wafer. As a rule, removal of the carrier does not pose any problem in the case of relatively thick wafers, for two reasons:

The relatively thick (only slightly thinned) wafer can still withstand mechanical loading to a certain extent and the greater the mechanical loading that the wafer can withstand in its final thickness, the more flexible the carrier can be. Accordingly, flexible carriers e.g. in the form of films can simply be pulled off mechanically.

With carriers that are less flexible, e.g. glass plates or other wafers, pulling off in this way is not of course possible. In this case separation is particularly difficult, as hard carriers are used in particular with greatly thinned wafers, so that high mechanical loading must definitely be avoided.

For this purpose, often layers are used between the wafer and the carrier, which as a result of chemical or physical change, reduce or eliminate the force of adhesion between the wafer and the carrier. An example of such a layer is wax, which becomes soft under the action of heat and thus facilitates separation. For this, the wax is heated until it is sufficiently fluid for the carrier to be displaced relative to the wafer. A disadvantage of this method is that in particular the sensitive wafer surface, which comprises the electronic components or the contacts to these, must be cleaned afterwards.

Basically, it is also possible to use special adhesives, which similarly lose their adhesiveness under the action of heat or radiation. Such a method is offered for example by the 3M company, where release of an adhesive layer is brought about by the use of laser energy.

Once again there is the problem that parts of the adhesive layer remain on the wafer surface, necessitating expensive cleaning.

As cleaning means additional expense, causes additional mechanical and often also chemical stressing of the thinned wafer and/or it is very difficult to ensure that all residues of adhesive are adequately removed, for many applications purely mechanical solutions are preferred, in which a separating layer is pulled mechanically off of the active side of the wafer, so that no residues remain.

A separating layer of this kind is disclosed in WO 2004/051708. This separating layer is in its turn used in the further development of the thinning process disclosed in WO 2007/099146. In this last-mentioned patent application, after the thinning of the wafer, a second carrier is provided on the (thinned) back, which is to support the separating process from the first carrier. Separation takes place between the separating layer and the active side of the wafer. In WO 2007/099146, a mechanical separating process is disclosed, in which the assembly of wafer and second carrier is led over a roll, so that the separating operation is effected mechanically. This second carrier is often a dicing film. With this method the second carrier must be flexible, as it must be able to follow a curvature. A problem with this method is that during separation, the stretchable carrier for its part can undergo deformation in addition to the curvature caused by the roll, so that the separating operation is not sufficiently controlled. In particular with very thin wafers, which are of course particularly mechanically sensitive, the method disclosed in WO 2007/099146, when using the deflecting roll, often leads to excessive forces perpendicular to the plane of the wafer, so that wafer breakage may occur, because the stretchable carrier does not fully follow the curvature of the roll surface. As a result, the separating front does not lie directly under the support of the roll, but is slightly displaced laterally. This leads to an increase in the vertical component of the force exerted on the wafer.

SUMMARY OF THE INVENTION

The object of the present invention was therefore to provide a method that permits separation of the wafer from the stabilizing carrier during thinning that is as reliable and gentle as possible.

This object is achieved by a method for mechanically separating a laminar structure from a carrier assembly comprising or consisting of a first carrier, wherein the laminar structure comprises a wafer and optionally a second, stretchable carrier (or consists of the wafer), comprising the following steps:
a) providing a layer system comprising the carrier assembly and the laminar structure
b) creating a mechanical stress in the region of the interface between carrier assembly and the laminar structure, so that the laminar structure is separated from the carrier assembly, by a method comprising
i) the steps:
i a) providing a separating aid,
i b) fixing the separating aid on the second carrier so that during the separating operation the second carrier remains fixed on the separating aid directly behind a separating front that arises during separation, and
i c) mechanically separating the laminar structure from the carrier assembly (1a) utilizing a separating front, and/or
ii) the following step:
ii) producing a vibration in the layer system, and/or iii) the following step:

iii) changing the temperature of the layer system or of parts of the layer system
with the proviso that when steps i a)-i c) are not included in the method, steps ii) and/or iii) lead to complete separation of the laminar structure from the carrier assembly.

The invention comprises variants i), ii) and iii), wherein variant i) also comprises steps a), i b) and i c), variant ii) comprises step ii) and variant iii) comprises step iii). The three variants can optionally be used individually or in any combination with one another and in the latter case all simultaneously or with a time lag. If in the following passages of the text no clear reference is made to one of these variants, the passages of the text relate to all three variants. For the case when variant i) is a component part of the method that is carried out, a second stretchable carrier is always provided.

The wafer can preferably be silicon wafers, which optionally are doped. Wafers of AlSb, AlAs, AlN, AlP, BN, BP, BAs, GaSb, GaAs, GaN, GaP, InSb, InAs, InN or InP may be preferred for many applications.

Unless specially mentioned within the scope of the following text, the components already separated from a wafer can also regularly be understood instead of the wafer that is to be separated.

A stretchable carrier is in this context a carrier that deforms under the mechanical separating conditions of the separating method that is carried out and in particular can be stretched. This stretching is in particular a problem because as a result controlling a separating front (see below) is not sufficiently possible if the stretching movement as such is not controlled. Preferred stretchable carriers are the dicing films usually employed in the industry but also other single-sided adhesive films or films that adhere otherwise.

"Fixing" means, in the context of this application, that a bond is produced by a force acting vertically between the two regions to be fixed. Preferred methods of fixing are gluing, holding by vacuum suction, and electrostatic holding. Fixing in the sense of this application expressly does not include the leading over a roll based on a pulling force described in WO 2007/099146.

The separating front is, in connection with variant i) of the method according to the invention, within the scope of this text, the region in which separation takes place. This means, ideally, it is a line on which the force of adhesion between the regions to be separated suddenly drops from 100% to 0%. In practical terms, the separating front will always be an area, and within this area the force of adhesion extends from <100% to >0. The end of the separating front is then of course the region where the force of adhesion has reached 0, and the start is where it is just <100%. In a usual separating operation, the separating front moves over the separating plane, until the areas to be separated from one another have been separated, and therefore no longer exert a force of adhesion against one another.

The force of adhesion (bond strength) between the regions can be determined by a person skilled in the art according to DIN 971/1:1996/09 and it is defined as the "totality of the binding forces between a coating and its substrate".

Step i b) of the method according to the invention takes place in such a way that, in the region that lies directly behind the separating front, i.e. adjoins the latter, but in which separation between laminar structure and the carrier assembly has already taken place, the second carrier is compelled to follow the movements of the separating aid exactly. In other words, the (area) fixation has the result that the extensibility of the second carrier does not affect the position of the separating front. In the method disclosed in WO 2007/099146, in contrast to the method according to the invention, a stretchable second carrier would be able (even if only slightly) to detach from the deflecting roll, as the force of adhesion between wafer and first carrier opposes perfect following of the movement of the deflecting roll (or along the periphery of the deflecting roll).

An object to be achieved by the present invention is to overcome this negative effect. For this, it is necessary to ensure that the second, stretchable carrier is fixed on the separating aid in such a way that the position of the separating front is not altered by the extensibility of the carrier. As already mentioned, what is decisive is that the carrier is fixed directly behind the separating front, so that it must follow the movements of the separating aid. This fixing can be temporary during the separating operation, e.g. by means of a roll, which fixes the second carrier on an area by electrostatic force directly behind its engaging surface. Alternatively and preferably, however, the second carrier is already fixed on an area on the separating aid before the start of the separating operation, and this fixation remains during the separating operation. However, this is not absolutely necessary for implementing the invention; it merely has advantages with respect to practicability.

A person skilled in the art will also immediately comprehend, in the sense of the present invention, the situation that the term "the carrier is fixed directly behind the separating front in such a way that it must follow the movements of the separating aid" also includes the case when the separating aid does not move, while the layer system between first carrier and wafer is influenced mechanically so that a separating front forms. This occurs for example and preferably in that the first carrier is a glass plate or a wafer, and a force is applied that pushes one side of the glass plate or of the wafer away from the separating aid. In selecting a corresponding grade of glass or a corresponding wafer material and in setting the force applied for pushing away, this leads to a (slight) curvature of the glass plate or of the wafer. This curvature leads to a shearing force in the whole system, so that a separating front forms where the layers with the smallest force of adhesion to one another come up against one another. With the corresponding set-up of the layer system, this interface is, in the sense of the invention, the surface of the active side of the wafer.

In the variant in which the first carrier is bent, in order to bring about separation it is preferable to use, as separating aid, a device that has a higher rigidity relative to the first carrier, preferably a glass plate or a wafer. This ensures that the separating aid does not follow the bending of the glass plate and therefore the separating operation is properly controllable. For a person skilled in the art it is immediately comprehensible that also in the separation variant in which the first carrier is bent, control of the separating front is a decisive factor. In this variant too, if the second, stretchable carrier were to follow the bending movement of the first carrier (optionally partially), the result would be that the position of the separating front and therefore the forces bringing about separation could not be controlled optimally with respect to their influence on the thinned wafer. Also in the last-described separation variant, the fixing of the second, stretchable carrier on the separating aid can of course be temporary, it naturally being necessary to ensure that the fixing is always completely within the region perpendicular to the (advancing) separating front.

Generally, in the method according to the invention it is preferable for separation to take place only using precisely one separating front. Separating operations with several separating fronts are certainly conceivable, for example with the separating aid or the first carrier in each case on the opposite sides being subjected to a bending force, but it is far more difficult to control more than one separating front, and particularly in the region where the separating fronts come up against one another, force conditions arise that are difficult to control.

Possible separating aids are on the one hand all objects that possess a (partially) convex surface, or can be deformed to such a convex surface. At the same time the separating aid must be designed so that the fixing of the second carrier is provided at least directly behind the separating front. Suitable separating aids can be e.g. rolls, in particular those with a large circumference or alternatively flexible, bendable plates, for example plexiglass disks, other plastic plates or thin metal plates.

On the other hand, suitable separating aids can also be rigid devices (see above), in particular when the deformation bringing about separation is not exerted on the separating aid but for example on the first carrier.

Of course it is possible, in the method according to the invention, for one or more further layers to be present between the first carrier and the wafer. These further layers are in each case a component part of the carrier assembly or of the laminar structure. To which of these two assemblies the respective further layer should be assigned depends, in the sense of this application, on where the two layers that have the lowest force of adhesion to each other are located in the layer system. The interface between these layers defines the "required breaking line" for separation, i.e. the interface between the laminar structure and the carrier assembly. Therefore all layers that are on the wafer side of this interface are part of the laminar structure, whereas the layers on the first carrier side as viewed from said interface are a component part of the carrier assembly. It is of course not excluded (although often preferred) that the interface with the lowest force of adhesion is directly on the wafer or even is adjacent to the first carrier, which therefore, in the sense of assignment of the individual layers to the respective assembly, are also to be regarded as layers.

Correspondingly, the laminar structure to be separated can comprise further layers apart from the wafer and the second (stretchable) carrier. However, what is decisive for carrying out variant i) of the present invention is that the further layers optionally present in the laminar structure to be separated are arranged so that, with respect to material, they a) follow a curvature of the separating aid (which optionally can be produced only during the separating operation) that is decisive for formation of the separating front or if the separating operation is not brought about by a curvature of the separating aid (but for example by curvature of the first carrier) remain uncurved relative to the separating aid and b) that they do not influence the position of the separating front by deforming.

It should also be noted that the fixing of the second carrier on the separating aid "directly behind the separating front forming during separation" relates, with respect to position, to the plane perpendicular to the separating front: the adhesion between separating aid and second carrier does not, of course, occur in the separating plane.

As already mentioned above, for variant i) of the method according to the invention it is decisive that the second carrier is fixed on the separating aid in such a way that the separating front is not influenced in its position by the material properties of the second carrier. The fixing can be permanent or temporary and it must not include the whole part already separated of the second carrier. It is only the region behind the separating front that is decisive. On an area means, in the sense of fixing, that perpendicularly to the direction of separation in the separating plane (or in the curvature of the separating aid projecting from the separating plane) the fixing area comprises a depth greater than 0, wherein the width of the area fixing is preferably predetermined by the separating front.

The mechanical separation in Step i c) of the method according to the invention preferably takes place by utilizing a curvature, which either is already present in the separating aid or can be produced therein. As an alternative that is also preferred, the mechanical separation in Step i c) takes place precisely because the separating aid does not follow a curvature that is brought into the whole layer system in some other way (for example by bending the first carrier). If the separating aid is e.g. a roll, mechanical separation takes place by rolling the roll over the surface of the second carrier directed away from the wafer. For this, the second carrier must first be fixed to the roll. Preferably fixing takes place in this case in a region in which the second carrier projects relative to the wafer (loose end). After fixing, the roll is led in a rolling motion over the surface of the layer system, so that a shearing force acts upon the layer system (also owing to fixing of the second carrier on the roll) and thus—with appropriate design of the layer system—the laminar structure of wafer and second, stretchable carrier is separated from the rest of the layer system, here in particular the first carrier (together with any further layers of the carrier assembly that are present, as always when considering separating or removal of the first carrier). As has already been described repeatedly, in this context it is decisive that the fixing of the second carrier on the separating aid (roll) is always located directly behind the separating front. Thus, in the case of a roll, during the separating operation this fixing must take place immediately after separation of each partial segment of the second carrier (and therefore of the laminar structure to be separated). Of course, the second carrier and the wafer bonded to it are subject to the curvature of the separating aid.

In an alternative and preferred separation method, the separating aid is flat. In this case, before separation in Step i c) a large-area fixing of large parts or of the whole surface of the second carrier on the separating aid can take place. Separation according to variant i) takes place through bending of the separating aid, so that in the region of the separating front (or initially, where the separating front forms) it assumes a convex curvature (similar to a roll surface with large circumference) relative to the layer system. Once again, the second carrier, on account of its fixing, is compelled to follow the convex curvature of the separating aid, and the wafer with it—once again with appropriate design of the layer system. Of course, for all separating operations according to variant i) it is necessary to ensure that the first carrier does not follow the forced convex deformation of the laminar structure, so that a shearing force develops between laminar structure and first carrier.

It should be pointed out once again that particularly good control of the separating front is possible according to variant i) of the method according to the invention. In fact—particularly with a high radius of convex curvature in the region of the separating front—the separating front is widened in the direction of separation, which means that the area in which the force of adhesion is just smaller than 100% (i.e. just smaller than the force of adhesion without the action of the separating aid), is enlarged until there is complete separation (force of adhesion=0). As a result, the force vector acting upon the layer system has a comparatively small part perpendicular to the separating plane. In particular this has the effect that the undesirable snapping-off, as is known e.g. in the unwinding of Tesa film, is avoided. In other words, it is possible on the basis of variant i) of the method according to the invention, to limit and control the particularly critical mechanical stress, i.e. the force acting perpendicularly to the separating plane. This can be achieved e.g. through the use of suitable materials for the (optionally bendable) separating aid, by means of appropriate surface geometries (e.g. roll diameter) and naturally through selection of a suitable material for the carrier (and naturally for the whole layer system).

A method according to the invention is preferred in which, in variant i), the separating aid is fixed on the second carrier by means of suction or by means of electrostatic charging. These forms of fixing have the advantage that (if desired) they can be used locally, i.e. only on a part of the separating aid, with precise control, but in particular they have the advantage that the fixing can easily be reversed again by switching off the suction or by removing the electrostatic charge.

As already mentioned, with the method according to the invention it is possible to separate very thin wafers, or laminar structures that incorporate a very thin wafer, from a first carrier. Accordingly, in a preferred method according to the invention the wafer thickness is ≤400 μm, preferably ≤150 μm, more preferably ≤80 μm, particularly preferably ≤20 μm and quite particularly preferably ≤10 μm.

A method according to the invention is preferred in which the layer system provided in step a) has one, two, three, four or more layers between the wafer and the first carrier and in which separation takes place between two adjacent surfaces of these layers or between the surface of the wafer and the layer adjacent thereto or between the surface of the first carrier and the layer adjacent thereto.

In this connection it is of course preferred for separation to take place between the surface of the wafer (active side of the wafer) and the layer adjacent thereto. In this way it is possible to make the active side accessible without residues remaining on the wafer that still require cleaning.

As already mentioned above, particularly in the production of very thin wafers and in particular when carrying out variant i) it is advantageous for the first carrier to possess high mechanical strength. Accordingly for the method according to the invention it is preferable for the first carrier to be a glass plate or a silicon wafer (with a larger thickness than the thinned wafer). Borosilicate glass or quartz glass is preferred as the material of the glass plate. Provided the first carrier is constructed of rigid materials, fixing of the first carrier during the separating operation is not absolutely necessary, as it cannot follow the convex curvature of the laminar structure (consisting at least of the (thinned) wafer and second carrier) during separation. Nevertheless, for reasons of process safety it is also preferable for a rigid first carrier to be fixed during separation.

However, the first carrier can also be material that is applied on the wafer surface (directly or indirectly) by spin coating, spray coating, laminating and/or pressing. Moreover, this material can be crosslinked or otherwise modified in its consistency, in order to influence the desired mechanical properties.

A method according to the invention is preferred in which there is at least one separating layer between the first carrier and the wafer. The purpose of a separating layer is to permit and/or ensure intentionally a required breaking line for separation, i.e. a plane in which the separating front proceeds, in particular in variant i), during separation. Additionally or alternatively, the separating layer should make possible or facilitate release of the wafer from the residual layer system of the carrier assembly including the separating layer itself, remaining after separation, so that the wafer can be cleaned easily.

When providing a separating layer in the sense of the invention, it may be preferable for the separating layer to be provided so that the separating plane introduced by it is directly adjacent to the wafer. In some cases, however, it may be preferable for the separating layer to define a separating plane, by which the first carrier is separated from further layers present in this case between the first carrier and the wafer. In this case one or more layers would remain on the wafer, which could for example be removed by a peeling process. The latter can be supported by the provision of another separating layer, which is directly adjacent to the wafer and which establishes the separating plane between the further separating layer and the wafer, which is decisive for the peeling process. The variant in which still further layers remain on the wafer (and are therefore a component part of the laminar structure in the sense of the above definition) can then be arranged so that the (actual) separating layer is also a component part of the laminar structure (and therefore after separation, optionally indirectly remains connected to the wafer) or so that the separating layer is a component part of the carrier assembly (and after separation optionally remains indirectly connected to the first carrier). In each case the arrangements of this separating layer required for this can easily be undertaken by a person skilled in the art with his technical knowledge and with the information provided in the present application.

It should also be pointed out that the separating plane naturally need not be even throughout, depending on the surfaces that are separated from one another. This applies in particular when separation takes place between a structured region of the front (active side) of the wafer and a layer above it.

For the method according to the invention, it is preferable for at least one of the separating layers to be a plasma polymer layer.

The advantage of plasma polymer layers is that they can be applied copying a contour, and can therefore optimally protect the surface of the active side of a wafer and their adhesion properties can be adjusted optimally to the separation requirements.

A method according to the invention is further preferred in which the layer system that is provided in step a) comprises, between the first carrier and the wafer, a layer of a hardened, partially hardened or hardenable elastomeric material.

This elastomeric material has advantages in particular in bonding the (possibly structured) wafer surface, on which optionally a (plasma polymer) separating layer can be applied, to a rigid, optionally flat first carrier.

Accordingly, a method according to the invention for separating a wafer is particularly preferred, wherein the layer system comprises the following layers in the stated order: a first carrier, a layer of elastomeric material as described above, a plasma polymer separating layer, a wafer and a second carrier.

Such a layer system is described in WO 2007/099146, already cited above, which is incorporated by reference in its entirety in the present application. In particular the parts that describe the arrangement of the separating layer and elastomer layer form part of the present application. WO 2004/051708, which also contains information about suitable separating layers, also forms part of this application by reference. In particular this information forms part of this application by reference.

As already mentioned above, a method may also be preferred according to the invention in which the layer system contains a second separating layer between the first carrier and in the layer of a hardened, partially hardened or hardenable elastomeric material. By means of this second separating layer it is possible to release the first carrier from the residual layer system remaining after separation, so that the first carrier can easily be used again.

A method according to the invention is preferred in which the layer system comprises a separating layer as described above and between one of the two surfaces of the separating layer and the surface (of another layer or of the wafer) adjoining this surface, there is a smaller force of adhesion than in all other layers and between all other layers of the layer system adjacent to one another.

In this way, in particular in variant i), the separating plane that is preferably utilized during the separating operation, is predetermined.

It is also preferable according to the invention to fix the first carrier on a holding means during the separating operation, preferably by means of vacuum suction or electrostatic charging.

A method is also preferred according to the invention in which the separating aid comprises an at least partially convex surface or the surface of the separating aid can be deformed at least partially to a convex surface. Preferably the curvature of the surface (that is present) or is provided by deformation is adapted so that the wafer does not break during removal of the first carrier. Such a setting can easily be determined by a person skilled in the art when carrying out the method according to the invention.

For the method according to the invention, the surface of the separating aid, on which the second carrier is fixed at least during separation, is preferably the outer surface of a cylinder or the surface of a cylindrical segment. This is also the case when separation takes place using a separating aid with convex deformation in the region of the separating front.

A method according to the invention is preferred in which the separating aid is a roll and for separating the wafer from the first carrier the roll is rolled over the side of the second carrier opposite the wafer and the second carrier is fixed directly behind the separating front on the roll.

A method according to the invention is particularly preferred in which the separating aid is a flexible plate.

In a particularly preferred method according to the invention, for detaching the wafer the flexible plate is deformed convexly at least partially (starting from the onset of separation in the region of the separating front) by applying a force that acts at least partially perpendicularly to the surface of the flexible plate and is directed away from the first carrier. At first only the distance of a part of the flexible plate from the first carrier is increased.

A method according to the invention is preferred in which the first carrier is fixed on a holding means, a flexible plate is used as separating aid and the holding means and the flexible plate each have at least one shaping and the force effecting separation (and the deformation of the flexible plate) acts between at least one shaping of the flexible plate and at least one shaping of the holding means (and/or acts there).

Moreover, the shapings in the sense of the preferred method according to the invention just described are preferably projections, on which the force bringing about separation can be applied. Preferably in each case one or more of the shapings of the flexible plate and/or of the holder is a stud. Particularly preferably, the studs are opposite, so that a force that pushes them apart can be applied between them, which finally brings about separation.

A method according to the invention is preferred in which the separating aid is an optically transparent plate, because in this case the separating operation can be observed and monitored visually particularly well. The following materials are then particularly suitable: polymethylmethacrylate (abbreviation PMMA, trade names Friacryl®, Vitroflex®, acrylic glass Plexiglas®, Limacryl® or Piacryl) or also polycarbonate (abbreviation PC, trade names Makrolon, Calibre or Lexan). The materials for the separating aid are selected by a person skilled in the art taking into account the requirements during separation such as loading of the wafer or requirements of the separating device.

Preferably the separating aid in the form of plexiglass plate has a thickness of 0.5-5 mm, preferably 1-4 mm, more preferably 2-4 mm or 3-4 mm, depending on the setting of the force of adhesion of the separating layer.

Alternatively or additionally, in a method according to the invention the curvature of the surface of the separating aid can also be brought about by allowing a swelling body to swell. Said swelling body must be suitably fixed on the separating aid, so that it can bring about the curvature. Of course, the separating aid itself can also be a swelling body.

As already mentioned above, as an alternative method it may also be preferable for the separating aid to be designed to be less flexible than the first carrier. In this case it is preferable for the separating operation to be triggered by a curvature of the first carrier, this first carrier preferably being a glass plate or a wafer. A preferred material for the separating aid is in this case a sinter plate. In the case of this alternatively preferred method, it is of course sensible not to fix the first carrier or only to fix it in such a way that the fixing does not hamper the (desirable) curvature.

A method according to the invention is preferred in which the second, stretchable carrier is a dicing film (also called blue tape). Preferred dicing films are UV-release tapes in standard use in industry, e.g. Lintec Adwill D.

Said dicing film (or a comparable material) is laminated onto the back of the wafer after thinning. For this, a large number of possibilities are available to a person skilled in the art. Usually said dicing film has one side on which adhesive is applied for sticking on the back of the wafer. The force of adhesion of the second carrier to the wafer can be altered preferably by means of thermal energy and/or UV radiation, so that optionally also the second carrier can be removed again from the wafer. Dicing films (as second carrier) with said adhesives are also called "thermorelease films" or "UV-release films".

Dicing films are stretchable in the sense of the present application.

Usually and preferably also for preferred methods according to the invention, during lamination the dicing film extends beyond the edge of the wafer or of the layer system to be separated and is held on its edge by means of a ring. This ring, which can consist of metal or a plastic, is usually called a "dicing frame". The frame forms, together with the film, a kind of drum, the membrane of which is the second carrier and wherein the rest of the layer system beginning with the back of the wafer rests on this membrane (dicing film).

In a particularly preferred method according to the invention, the layer system comprising the dicing film is now placed in a fixture, in which the first carrier is fixed on a chuck (preferably by vacuum suction).

Now another chuck is fixed on the bare back of the dicing film (second carrier), once again preferably by vacuum suction. The two chucks are preferably positioned so that they are superimposed on one another laterally in top view. When it is used for carrying out variant i), the chuck on which the dicing film is now fixed is preferably made of a bendable (flexible) material and with a thickness such that it can fulfill the function of the separating aid to be used according to the invention.

For carrying out variant i), the two chucks (holding means and separating aid) have, preferably at least on one surface of the device, a region that projects beyond the surface of the wafer or of the layer system. Between these regions, with appropriate fixing it is now possible to exert a force, which has the result that the chuck (separating aid) holding the dicing film (the second carrier) on one side is removed from the other chuck (holding means). As a result, the separating aid bends and the desired separating front is formed.

It is perfectly possible to control the acting force precisely, so that the wafer is not stressed excessively during the separating operation.

If a preferred method for carrying out variant i) is carried out with a separating layer and/or the preferred layer system described above, it is possible to ensure a clean separation even of very greatly thinned wafers without excessive mechanical loading (breakage). It is also possible to measure the force applied and/or adjust it, so that a maximum force is not exceeded. It is also possible, by means of the force, to set a fixed distance of the two points/lines/surfaces on which the force is applied. In this way, an originally flat, but bendable separating aid produces, owing to its deformation, a continuous separating front, since the deformation of the separating aid is propagated in two dimensions, until complete separation takes place and the separating aid can once again resume its original shape.

As already described above, it is preferable for the two carriers to be fixed by vacuum suction, but basically there are also other possibilities, e.g. fixing by means of adhesives.

If a dicing frame is used in a separation method according to the invention, the dicing frame is preferably arranged so that the surface curvature of the separating aid can also be transferred to the dicing frame. Thus, the dicing frame and the clamped dicing film follow the curvature in the region of the separating front, wherein according to the invention they are fixed on the separating aid directly behind the separating front. The wafer once again follows the bending (curvature) of the dicing film (second carrier), so that a shearing force develops between the wafer and the first carrier.

As already mentioned above, an advantage of the method of the invention according to variant i) is, particularly in its preferred embodiments, that the separating front represents a relatively large area, so that the shearing forces perpendicular to the wafer surface can be kept small.

Without being bound by a theory, on the basis of the method according to the invention a force distribution gradient develops within the separating front (i.e. a force distribution gradient perpendicular to the line of actual separation (the end of the separating front), i.e. the line where the force of adhesion between the surfaces to be separated is 0), wherein the depth of the separating front (and hence the slope of the gradient) can be controlled optimally within the scope of the method according to the invention, so that the mechanical loading of optionally very thin wafers can be kept as low as possible.

A particularly preferred method according to the invention is one in which the layer system comprises the following layers in the stated order:
  a first carrier consisting of a glass plate or a wafer,
  a layer of elastomeric material as described further above,
  a plasma polymer separating layer, as described further above
  a wafer and
  a dicing film as second carrier.

A method according to the invention that is also particularly preferred is one in which the layer system comprises the following layers in the stated order:

a first carrier consisting of a glass plate or a wafer,
a second separating layer,
a layer of elastomeric material, as described further above,
a plasma polymer separating layer, as described further above,
a wafer and
a dicing film as second carrier.

A preferred component part of the invention is also the use of a plexiglass plate, which is arranged so that, using vacuum suction, a second carrier as described above can be fixed on it, as separating aid in the mechanical separation of a laminar structure (comprising the second carrier and a wafer) from a first carrier. Of course, for the use according to the invention, the layer system comprising the laminar structure and the first carrier is preferably arranged as for one of the preferred methods described above.

A device that is set up for carrying out the method of the invention according to variant i) also forms part of the invention. In particular such a device comprises a means for fixing the first carrier and a separating aid, as described above. This separating aid serves simultaneously as a means for fixing the second carrier. A device according to the invention also preferably comprises means for bringing about fixing by means of electrostatic or suction force, a holding means for fixing the first carrier and preferably a means by which a force can be exerted only on a part of the separating aid, so that the force causes the separating aid to undergo convex curvature away from the first carrier.

A chuck, which consists of a plexiglass plate and preferably can be subjected to vacuum suction, is preferred as separating aid.

The method according to the invention comprising, of the three variants i), ii), and iii), either only variant ii) or only variant iii) or only variants ii) and iii) can be used for bringing about the complete mechanical separation of a laminar structure from a carrier assembly. In such a case, variant i) is not carried out. If variants ii) and iii) are both applied, this can occur either simultaneously or with a time lag. However, also according to the invention, all three variants or variant i) with ii) or variant i) with iii) can be applied, in each case simultaneously and/or with a time lag.

Complete separation does not necessarily mean that laminar structure and first carrier are separated spatially from one another. Rather, it may be necessary for the laminar structure and the carrier assembly to be held in their positions during separation by means of holding devices, for example the chucks described above, to make complete separation through vibration and/or temperature change possible. This can for example ensure good mechanical or thermal contact.

Separation means in this case the elimination of the force of adhesion at least between two layers of the layer system (wherein wafer and first carrier in this sense are also to be regarded as layers).

In a preferred embodiment of the method according to the invention, variant ii) is used alone or in combination with one of variants i) or iii) or in combination with variant i) and variant iii). For producing the vibrations, it is possible to use any suitable devices for generating vibrations. The use of ultrasound generators is preferred. The use of piezo ceramics is particularly preferred.

In a preferred embodiment of the method according to the invention, in step ii) the vibration is transmitted by direct mechanical contact from the vibration-generating device to the layer system. The vibration-generating device can even for example already be contained in one of the aforementioned holding devices or connected thereto. Preferably the vibration is transmitted by direct mechanical contact of solid bodies. This can for example occur when the holding devices or chucks, as described above, fix the first carrier and/or the second carrier by electrostatic charge or vacuum. Preferably, for their part, the chucks produce or transmit the vibrations to the first carrier and/or the second carrier.

It may also be preferable if the vibration is transmitted by a liquid, preferably water, preferably by a film of liquid and particularly preferably a film of water.

It is particularly preferable if the vibration is transmitted from the vibration-generating device to the first carrier. A method in which the vibration is transmitted from the vibration-generating device to the wafer also forms part of the present invention. However, in the sense of the invention, this must not lead to damage of the wafer.

A method according to the invention is preferred in which the vibration is the frequency of the natural frequency of at least one of the layers of the layer system. The natural frequency of an infinite plate is calculated from formula I:

$$f_n = \frac{n}{2d}\sqrt{\frac{E}{\rho}}$$

where n=1, d is the thickness of the plate, E is Young's modulus and $\rho$ is the density of the plate material. For n=2, 3 to infinity, the corresponding harmonics are obtained. Table 1 shows examples of natural frequencies and some harmonics calculated from this formula for plates made of glass, aluminum, silicon and silicone, such as are usually employed in wafer technology and in the method according to the present invention. Silicon is used as wafer material and as material for carriers. Glass and aluminum are also used as carriers. Silicone is suitable for example as material for the elastomer layers described above.

TABLE I

| Material | Density kg/dm³ | Young's modulus MPa | Speed of sound m/s | Thickness μm | n = 1 Natural frequency kHz | n = 2 Natural frequency kHz | n = 3 Natural frequency kHz | n = 4 Natural frequency kHz |
|---|---|---|---|---|---|---|---|---|
| Silicone | 1.2 | 6 | 71 | 100 | 354 | 707 | 1061 | 1414 |
| Silicone | 1.2 | 6 | 71 | 130 | 272 | 544 | 816 | 1088 |
| Silicone | 1.2 | 6 | 71 | 150 | 236 | 471 | 707 | 943 |
| Glass | 2.5 | 60 000 | 4899 | 600 | 4082 | 8165 | 12 247 | 16 330 |
| Silicon | 2.3 | 110 000 | 6871 | 50 | 68 710 | 137 420 | 206 129 | 274 839 |

TABLE I-continued

| Material | Density kg/dm³ | Young's modulus MPa | Speed of sound m/s | Thickness μm | n = 1 Natural frequency kHz | n = 2 Natural frequency kHz | n = 3 Natural frequency kHz | n = 4 Natural frequency kHz |
|---|---|---|---|---|---|---|---|---|
| Aluminum | 2.7 | 113 000 | 6469 | 6700 | 483 | 966 | 1448 | 1931 |
| Aluminum | 2.7 | 113 000 | 6469 | 10 000 | 323 | 647 | 970 | 1294 |
| Aluminum | 2.7 | 113 000 | 6469 | 15 000 | 216 | 431 | 647 | 863 |
| Aluminum | 2.7 | 113 000 | 6469 | 2500 | 1294 | 2588 | 3882 | 5175 |
| Aluminum | 2.7 | 113 000 | 6469 | 9700 | 333 | 667 | 1 000 | 1334 |

Even though formula I only provides approximate values for the natural frequencies, it can be seen from the table that the natural frequency of a thinned wafer of 50 μm is at least an order of magnitude above the natural frequency of all other layers. Therefore as a rule it is possible to cause the other layers of the layer system to vibrate at their natural frequency without exciting silicon to strong vibrations.

Therefore a method according to the invention is preferred in which in step ii) one of the layers of the layer system is excited to vibrate at its natural frequency. A method according to the invention is particularly preferred in which the layer excited to vibrate at its natural frequency is not the wafer. A method according to the invention is most preferred in which the layer excited to vibrate at its natural frequency is the first carrier.

A method according to the invention is also preferred in which in step ii) one of the layers of the layer system is excited to vibrate at its natural frequency and wherein the layer system provided in step a) has at least one further layer between the wafer and the first carrier.

Table I shows that the natural frequency of a glass plate can differ markedly from the natural frequency of an elastomer layer. If a glass plate of the stated thickness is used as carrier in the method according to the invention, on which an elastomer layer is applied, the glass plate can be excited to vibrate at its natural frequency. The elastomer layer would then only be excited at about its twelfth harmonic. The elastomer layer would thus essentially not resonate. As a result, mechanical stresses develop between the glass plate and the elastomer layer, which can lead to separation at the interface between glass plate and elastomer layer. At the same time, the elastomer layer damps the vibrations, which are therefore only transmitted to the wafer in attenuated form.

Therefore a method according to the invention is preferred in which in step ii) the first carrier of the layer system is excited to vibrate at its natural frequency.

A method according to the invention is particularly preferred in which the layer system, which is provided in step a), comprises a layer of a hardened, partially hardened or hardenable elastomeric material between the first carrier and the wafer, as described above. Moreover, it is preferable according to the invention if the first carrier consists of glass. It may then be preferable, in the sense of the invention, for separation to take place between the first carrier and the elastomer layer.

Said separation that does not take place on the surface of the wafer is mainly advantageous when the side of the wafer opposite the first carrier is structured in such a way that mechanical separation is only possible with difficulty, without destroying the wafer, owing to the form closure between the wafer surface and the adjoining surface of the carrier system. This applies to all variants i), ii) and iii) of the method according to the invention. The (residual) layers of the laminar structure that possibly remain after separation (as described above) can then be removed from the wafer in a suitable way, for example by peeling or similar.

Similar considerations as for the elastomer layer also apply to the separating layer as described above and other layers of the carrier assembly.

Table I shows, for the example of aluminum, that the natural frequency of the first carrier can be varied. If aluminum is used as first carrier or if the first carrier is bonded to aluminum or other materials so that a common vibration system (an oscillatory system) is formed, the natural frequency of the first carrier can be set in such a way that it corresponds to the natural frequency of the elastomer layer or of the separating layer, or so that the first carrier can be excited well, as needed, but its natural frequency (or the natural frequency of its vibration system) is above the natural frequency of the elastomer layer, so that the latter still does not resonate on excitation of the first carrier in the range of its natural frequency. With an appropriate choice of layers of the carrier assembly (or of the vibration system), the vibration can be transmitted to the interface with the wafer and separation of carrier assembly and wafer takes place between the surface of the wafer and the adjacent surface of the carrier assembly. It should be pointed out that the preferred plasma polymer separating layers are set up in such a way that they correspond in their vibration behavior to the elastomer layer or form a vibration system together with it.

Therefore a method according to the invention is preferred in which in step ii) the layer of the carrier assembly directly adjacent to the wafer is excited to vibrate at its natural frequency. A method according to the invention is particularly preferred in which separation of carrier assembly and wafer takes place between the surface of the wafer and the adjacent surface of the carrier assembly.

In another preferred embodiment of the method according to the invention, variant iii) is used alone or in combination with one of variants i) or ii) or in combination with variant i) and/or variant ii). In this case a mechanical stress is produced in the layer system by changing the temperature of the layer system or of parts of the layer system, which leads to or contributes to separation of first carrier and wafer (and therefore of carrier assembly and laminar structure).

The separation of layers of a layer system by altering the temperature according to the method of the invention is based exclusively or essentially on the different coefficients of thermal expansion for the various materials of the individual layers of the layer system, for example first carrier, second separating layer, elastomer layer, separating layer and wafer. When the temperature changes within the layers, forces develop, so that the layers should expand by varying amounts in the direction of the planes of the surfaces. In contrast, sideways expansion of the layers is only possible to a limited extent or not at all, owing to the force of adhesion between the layers together or to the first carrier and to the wafer. In this way, strong shearing forces develop between the surfaces of the layers, which can lead to separation of the layers between the surfaces of two layers adjacent to each other.

Therefore a method as described above is preferred in which the layer system contains a layer (including the wafer and the first carrier) whose coefficient of thermal expansion differs in each case at least by a factor of 2, preferably 4, particularly preferably 6 and quite particularly preferably 10 from the coefficient of thermal expansion of any other layer of the layer system. However, this does not include any layers that are provided on the side of the wafer opposite the first carrier. A method according to the invention is also preferred in which two adjacent layers of the layer system have the stated different coefficients of thermal expansion.

Naturally, temperature changes can also lead to changes in the physical properties or the chemical structures of the layer materials. Separation methods that are essentially based on the fact that the binding forces between the layers of the layer system or within the layers are relieved completely or essentially by changes of the state of aggregation of the layer materials of solid substances to liquid, gel-like or gaseous substances are expressly not the subject matter of the present invention.

However, the present invention also relates to methods in which a part of a solid is the part of a layer material that undergoes transition to the liquid, gel-like or gaseous state. However, not more than 10 wt. %, preferably not more than 5 wt. %, particularly preferably not more than 1 wt. % and most preferably not more than 0.1 wt. % of the layer material of each of the layers between which or in which separation takes place may undergo transition from the solid to the liquid, gel-like or gaseous state.

The method according to the present invention is based on separation occurring because the force of adhesion, which holds the layers together, is opposed to a force, which overcomes this force (mechanical separation).

Heating can be effected using any suitable devices. Preferably the entire layer system is heated.

As described above, the first carrier preferably consists of solid materials. Direct contact of the carrier with the wafer could, through the action of shearing forces through the hard surface of the first carrier, lead to damage to the wafer. In a preferred method according to the invention, there is—as described above—therefore at least one further layer, preferably at least one elastomer layer and/or a separating layer, in the layer system between the first carrier and the wafer. As a rule elastomer layers have coefficients of thermal expansion that are markedly different from the coefficient of thermal expansion of silicon. Furthermore, the coefficient of thermal expansion can be varied by appropriate selection of material. In a preferred method according to the invention there is therefore at least one elastomer layer between the first carrier and the wafer.

In a preferred method according to the invention there is at least one layer that consists completely or partially of a silicone elastomer between the first carrier and the wafer. Silicone elastomers are characterized in that their mechanical properties, in particular their strength and hardness, only change to a particularly slight extent when there are temperature changes, and therefore even at high temperatures, as are required for the separating operation in some circumstances, they still possess sufficient strength to withstand the forces that develop through shearing. Materials that soften too much when the temperature rises would absorb and neutralize the shearing forces by deformation. The coefficient of thermal expansion of silicone elastomers is about an order of magnitude above that of silicon and glass, so that the production of stresses and shearing forces through temperature changes between layers of silicone materials and silicon and glass layers is particularly effective.

A method according to the invention is further preferred in which there is at least one separating layer between first carrier and wafer. As described above, the separating layer endows the layer system with a required breaking point, upon which small forces of adhesion act, therefore making easy separation possible. This is also an advantageous embodiment when carrying out variant iii). A method according to the invention is particularly preferred in which there is at least one elastomer layer and a separating layer between first carrier and wafer. In this case the elastomer layer can serve for production of the shearing forces and the separating layer can serve as the required breaking point. It is then most preferred if the layers of the layer system are arranged in the order first carrier, elastomer layer, separating layer and wafer, as described above. The separating layer is then preferably a plasma polymer layer, as described above, which in its turn preferably possesses thermal expansion behavior similar to that of the elastomer layer.

A method according to the invention is further preferred in which there are at least two separating layers between first carrier and wafer. A method according to the invention is particularly preferred in which there is an elastomer layer and two separating layers between first carrier and wafer. It is most preferred if the layers of the layer system are arranged in the order first carrier, second separating layer, elastomer layer, separating layer and wafer, as described above.

With such an arrangement, separation of first carrier and wafer (of carrier assembly and laminar structure) can take place on the separating layer or on the second separating layer. It is further preferred if, with this arrangement, the elastomer layer brings about the production of the shearing forces during separation according to variant iii). The separating layers serve not only as required breaking points, as above, but also ensure that any residual layers (as described above) can easily be removed from wafer and/or carrier.

During processing of wafers, the layers used are often subjected to large temperature variations. It is therefore important that the layer systems do not delaminate and thus already lead to separation of first carrier and wafer during processing of the wafer. Because, as described above, elastomer layers subject the laminar structure to particularly large stresses and shearing forces when there are temperature variations, appropriate precautions must be taken to prevent separation of first carrier and wafer during processing.

A method according to the invention is therefore preferred wherein the layer system provided in step a) contains at least one elastomer layer and was produced in such a way that, in the layer system at exactly a temperature between 20° C. and 200° C., no mechanical stresses develop between the surfaces of the elastomer layer (4) and the adjacent surfaces and the elastomer layer is hardened.

The preferred method for achieving this state is hardening of the elastomer between the adjacent layers of the laminar structure, at the temperature at which there should be freedom from stresses. The temperature is then preferably selected so that the laminar structure is preserved at all processing temperatures applied. In particular the laminar structure should remain stable at room temperature. The hardening temperature depends on the material, so that in order to reach a desired temperature, at which there is the stated freedom from stresses, a person skilled in the art will modify the elastomeric material correspondingly.

Therefore a method according to the invention is preferred wherein the separation takes place or is supported by (i) heating the layer system or parts thereof to temperatures that are at least 100° C., preferably 150° C. above the temperature at which no mechanical stresses develop between the surfaces of the elastomer layer (4) and the adjacent surfaces, or (ii) cooling the layer system or parts thereof to temperatures that are at least 100° C., preferably 150° C. below the temperature at which no mechanical stresses develop between the surfaces of the elastomer layer (4) and the adjacent surfaces.

As a result, the temperature at which separation is performed is sufficiently different from the temperatures at which the wafer is processed.

A method according to the invention is also preferred wherein the layer system provided in step a) contains at least one elastomer layer containing or consisting of silicone, which was hardened in a range from 80° C. to 220° C., preferably in a range from 120° C. to 180° C. between the layers of the layer system, separation being carried out at temperatures in the range from 200° C. to 400° C., preferably in the range from 250° C. to 350° C.

BRIEF DESCRIPTION OF THE DRAWINGS

The invention is explained in more detail below on the basis of drawings and an example. Drawings and examples are not, however, intended to limit the invention.

The reference symbols have the following meanings:
1 first carrier
1 *a* carrier assembly (in the example given in FIGS. 1 to 3)
2 elastomer layer
3 separating layer
4 structured front of the wafer
5 back of the wafer
6 separating part of the layer system, comprising the first carrier
7 wafer (front and back)
8 laminar structure (in the example given in FIGS. 1 to 3)
18 adhesion-promoting side of the second carrier
19 layer system to be separated (without second carrier)
20 second carrier
21 dicing frame
28 holding means for fixing the first carrier
29 separating aid
30, 31 alternatives for direction of action and point of application for the force bringing about separation
33 separating front
34 end of the separating front
a edge length of the body or volume element
a+s edge length after length change through heating
d plate thickness

DETAILED DESCRIPTION

Figure 1:
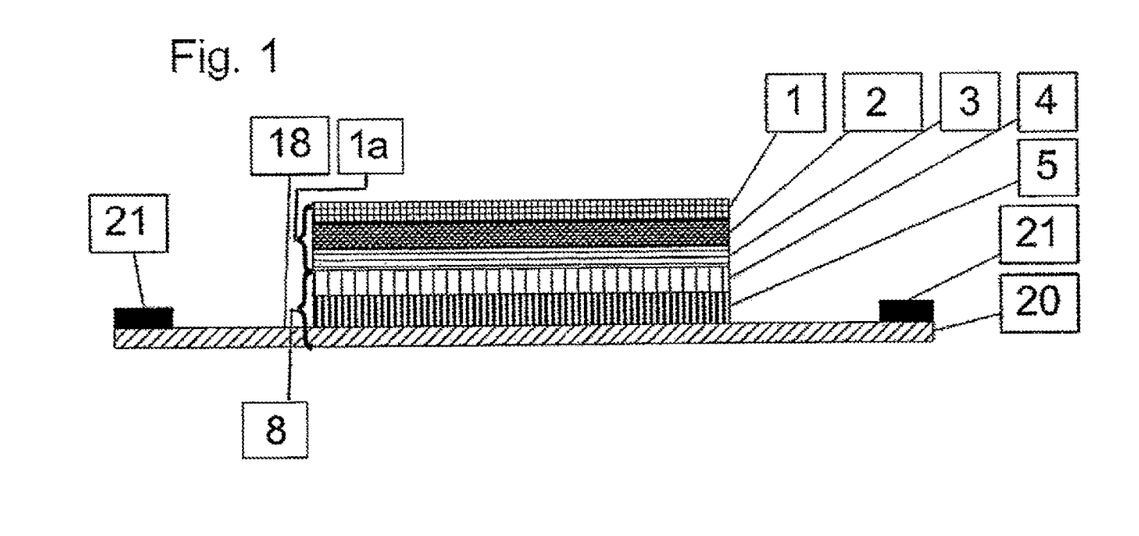
FIG. 1 shows a layer system to be separated, comprising a wafer after thinning.

FIG. 1 shows the layer system to be separated 19, 20. A first carrier 1, which is preferably in the form of a glass plate, is bonded to an elastomer layer 2, which in its turn is bonded to a separating layer 3. The separating layer 3 is bonded to the active front of the wafer 4, 5. The force of adhesion between the separating layer 3 and the wafer 4, 5 is the smallest within the whole layer system. The second carrier 20 is fastened to the back of wafer 5. Said second carrier can be in the form of dicing film, which is clamped in a dicing frame 21.

Figure 2:
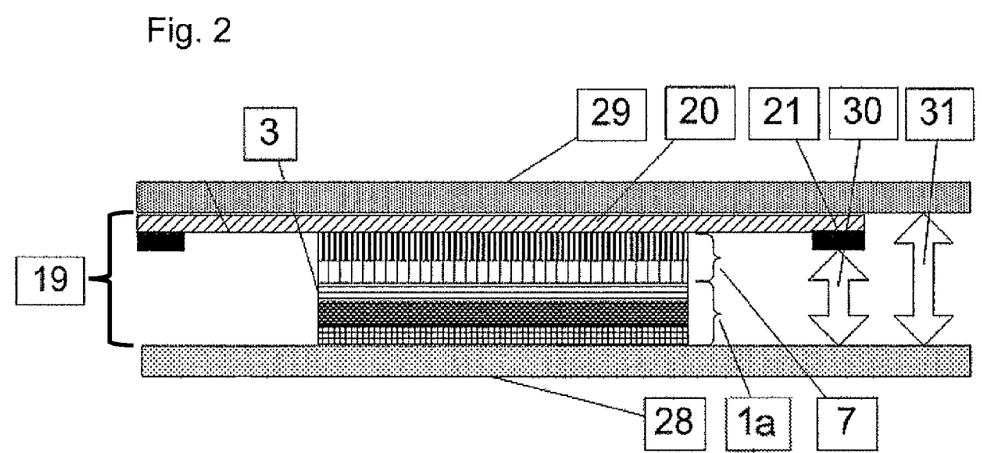
FIG. 2 shows a layer system to be separated, which is already fixed for the separating operation

FIG. 2 shows the layer system to be separated 19, 20 in the state ready for separation. The first carrier is fixed on a means for fixing the first carrier 28. The layer system to be separated 1a which comprises the first carrier, still has full-surface bonding with the wafer (front and back) 7. The separating, aid 29 is bonded flat to the second carrier 20 and is aligned parallel to the second carrier as well as to the first carrier. Arrows 30 and 31 show possible directions of action and points of application for the force that brings about separation.

Figure 3:
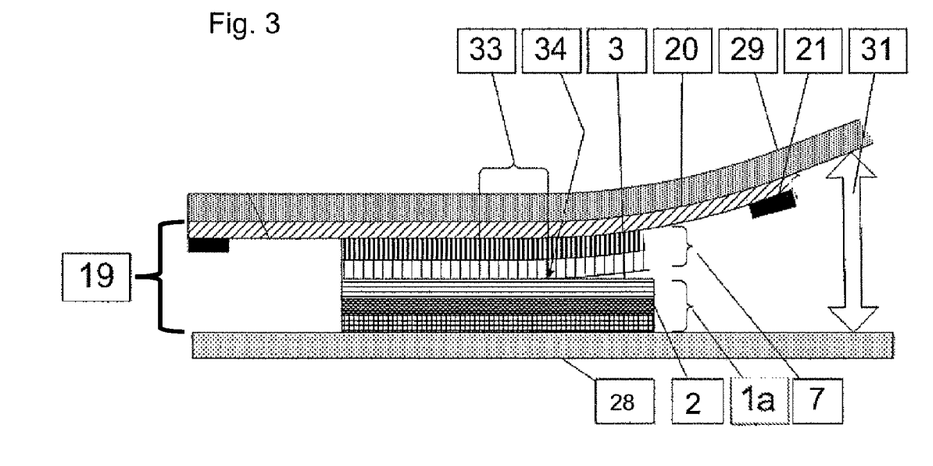
FIG. 3 shows the layer system to be separated during the separating operation.

FIG. 3 shows the separating operation, in which the layer system to be separated 19, 20 is separated into the part of the layer system to be separated 1a, comprising the first carrier and the laminar structure 7, 20. This is brought about by the force applied in the region of arrow 31, which has the result that the separating aid 29 is moved away on one side from the holding means for fixing the first carrier 28 and so also from the first carrier 1. This causes curvature of the separating aid. This curvature is followed completely by the second carrier 20 and hence also by the wafer 7. As a result, a shearing action develops in the layer system to be separated 19, which acts in the region of the separating front 33, At the end of the separating front 34, the force of adhesion between the part of the layer system to be separated 1a and the wafer 0. In the present example, the separating layer 3 ensures that the separating plane runs between the wafer 7 and the separating layer 3.

Through the area fixing of the second carrier 20 to the separating aid 29 (also) immediately adjacent to the separating front 33, optimum transmission of force is ensured: the vertical forces acting on the wafer are relatively small and increasing within a gradient over the separating front 33 up to the end of the separating front 34. As a result, particularly in the region of the separating front 33, a virtual curvature angle is produced, which approaches infinity and therefore loads the wafer 7 as little as possible.

Figure 4:
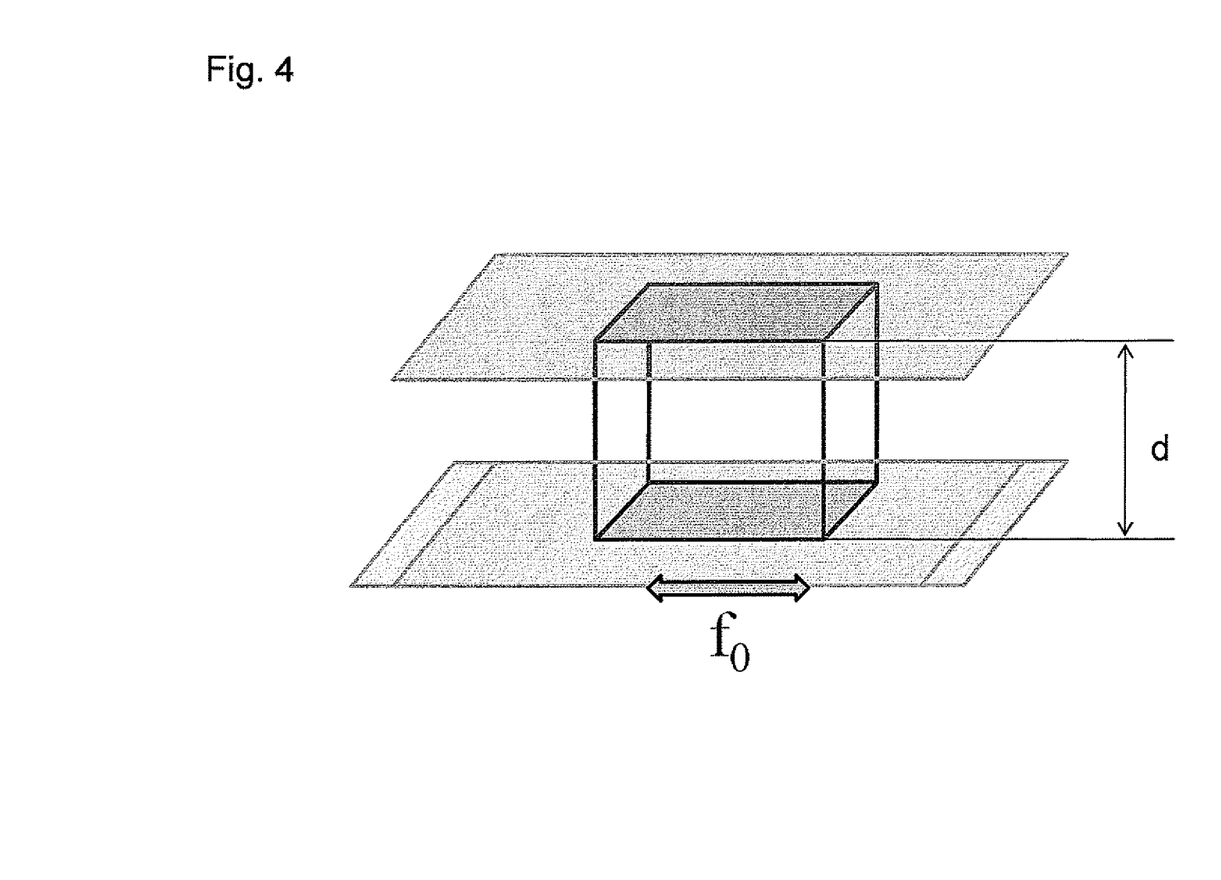
FIG. 4 shows a schematic model for an infinite vibrating plate.

FIG. 4 shows the vibration system that is present on excitation of the natural frequency of an infinite plate. It is a model for the vibrations of the layers in the layer system. The natural frequency of such a layer is calculated to a first approximation from the formula $$f_n = \frac{n}{2d}\sqrt{\frac{E}{\rho}}$$

where n=1, d is the thickness of the plate, E is Young's modulus and $\rho$ is the density of the plate material. The natural frequency thus depends essentially only on the material properties and the layer thickness.

Figure 5:
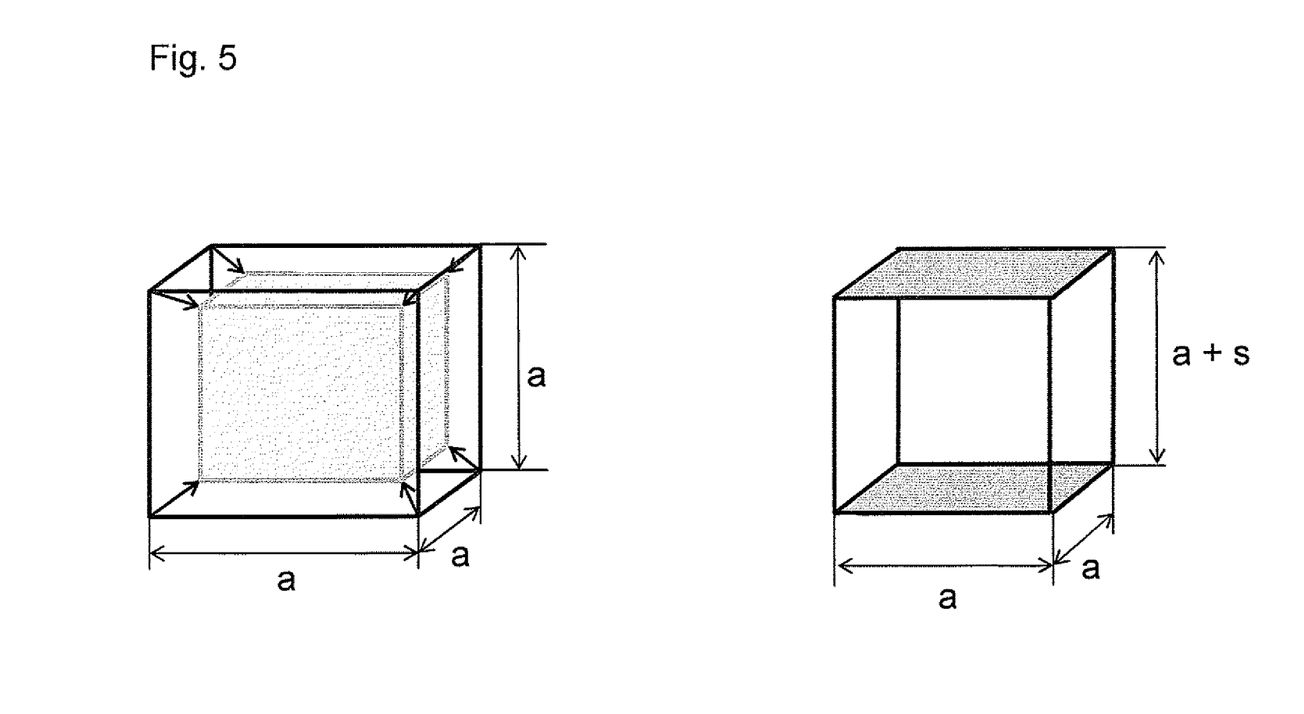
FIG. 5 shows schematically the linear expansion and the resultant stresses in a body.

FIG. 5 shows the behavior of a volume element of a solid body that is subjected to a volume change because of a change in temperature. The diagram on the left shows a free volume element, in which the volume element deforms symmetrically and stress-free. On the right, a volume element is shown, which is fixed at top and bottom. This is a simplified representation of the situation of a layer in the layer system to be used according to the invention on the assumption that the volumes and interfaces of the other layers do not change when the temperature changes. A volume change is essentially only still possible in the direction perpendicular to the upper and lower interface. In the direction of the interface, stresses develop, because the fixed surfaces cannot change their linear dimension. Delamination occurs on these interfaces when the force produced by the stresses on the interfaces exceeds the force of adhesion between the interfaces.

EXAMPLES

Example 1

Separation According to Variant i

The front of a wafer, i.e. the side on which the electronic components are located, is coated by PECVD with a plasma polymer separating layer. This separating layer is adjusted with respect to its adhesion properties so that it has relatively low adhesion on the side facing the wafer, whereas there is high adhesion to the layer applied subsequently on the side turned away from the wafer. This last-mentioned layer is, in the present example, a silicone elastomer layer, which is first applied on a glass plate as first carrier. Then the wafer is bonded to the already applied separating layer on the separating layer side with the elastomer layer applied on the glass plate. It is now a layer system comprising the wafer, the separating layer, the elastomer layer and the glass plate as carrier.

Bonding can be effected with typical bonds known from the prior art. For details on preparation of the layer system described, reference may be made for example to WO 2007/099146.

Next, the wafer is thinned on its exposed back. Thinning is carried out by methods known from the prior art. During this, the wafer is thinned to a thickness of 50 μm. After thinning, the layer system, which comprises the wafer, is transferred to equipment in which the back of the wafer is further processed by etching. The etching serves in particular for correcting surface damage of the back of the wafer, which was caused during thinning.

The etching operation takes place according to the prior art, e.g. by a wet chemical process by means of an etching bath or a dry chemical process by means of plasma. In particular, etching completely removes damage in the form of flaking and cracks and the wafer acquires higher mechanical and thermal resistance.

Then a dicing film, e.g.: Lintec Adwill D is laminated with its adhesive side onto the layer system. Now the layer system was placed in a separating device, in which the back of the glass plate is fixed by means of a vacuum chuck so that it can no longer be moved.

A special vacuum chuck, which consists of a 3 mm thick plexiglass plate, is now fixed as separating aid on the back of the dicing film.

After the vacuum has built up on the two vacuum chucks, a force perpendicular to the plane of the wafer is applied on one side of the plexiglass plate. This force causes the flexible plexiglass plate to bend, and the bending leads to formation of a separating front in the layer system. This separating front runs in the plane between the front of the wafer and the separating layer. The bending of the plexiglass plate is convex relative to the first carrier. Whereas the wafer and the second carrier follow the continuous bending of the plexiglass plate (vacuum chuck), this is not the case with the rest of the layer system, which is fixed on the first carrier. The resultant shearing force brings about the separation of the wafer from the separating layer.

The force can be adjusted so that even very thin wafers as in the present example with a thickness of 50 μm can be separated undamaged from the first carrier. This occurs because the separating front runs over the whole separating surface at controllable speed.

Finally the front of the wafer is freed from the rest of the layer system. After separation, the vacuum of the two vacuum chucks can be switched off. Now the wafer, laminated on a dicing film, can be removed and transferred to subsequent processing steps, e.g. separation by dicing.

Example 2

Separation According to Variant ii

Example 2 is carried out as for Example 1 (up to the start of actual separation), except that during building of the layer system an additional plasma polymer separating layer is applied on the glass plate before applying the elastomer layer and is adjusted with respect to its force of adhesion so that it adheres more firmly to the elastomer layer (after preparing the layer system) than to the glass plate and so that the force of adhesion between the glass plate and this separating layer is the least between two layers in the layer system. In addition, a normal chuck is used for fixing the dicing film instead of the flexible plexiglass disk. No forces that could contribute to separation of the layer system are exerted on this chuck. The glass plate is fixed on the (aluminum) chuck so that there is a common vibration system, which is about 4 mm thick. This is excited with a frequency of 1 MHz. After about 10 minutes, the wafer is separated from the carrier assembly. Separation takes place between the additional plasma polymer layer and the glass plate. The laminar structure can be removed simply by lifting from the carrier assembly (glass plate).

Example 3

Separation According to Variant iii

Variant iii) is carried out as for Example 1 (up to the start of actual separation), but without using the dicing film and plexiglass disk. Bonding in the preparation of the layer system takes place at 150° C., wherein the elastomer layer is hardened. Then the layer system is cooled to 20° C. For separation, the layer system is heated to 330° C. for 10 minutes. Separation takes place between the plasma polymer layer and the wafer. The laminar structure can be removed by simply lifting from the carrier assembly.

the invention claimed is:

1. A method for mechanically separating a laminar structure from a carrier assembly comprising a first carrier, wherein the laminar structure comprises a wafer and a second, stretchable carrier, the method comprising:
   a) providing a layer system comprising the carrier assembly and the laminar structure: and
   b) creating a mechanical stress in the region of the interface between the carrier assembly and the laminar structure, so that the laminar structure is separated from the carrier assembly, by a method comprising:
     i a) providing a separating aid, having a first end and a second end opposite said first end,
     i b) fixing the separating aid on the second carrier so that during the separating operation the second carrier remains fixed on the separating aid directly behind a separating front that arises during separation, wherein the fixing does not include leading the second carrier over a roll using a pulling force, and i c) mechanically separating the laminar structure from the carrier assembly utilizing precisely one separating front, wherein step i c) comprises applying force to a first end of the separating aid, wherein said force causes said separating aid to bend during step i c).

2. The method as claimed in claim 1, wherein the separating aid is fixed on the second carrier by vacuum suction or by means of electrostatic charging.

3. The method as claimed in claim 1, wherein the wafer has a thickness of ≤150 μm.

4. The method as claimed in claim 1, wherein there is at least one plasma polymer separating layer between the first carrier and the wafer.

5. The method as claimed in claim 1, wherein the layer system comprises, between the first carrier and the wafer, a layer of a hardened, partially hardened or hardenable elastomeric material.

6. The method as claimed in claim 1, wherein the layer system comprises the following layers in the stated order:
the first carrier,
a layer of a hardened, partially hardened or hardenable elastomeric material,
the plasma polymer separating layer,
the wafer and
the second carrier.

7. The method as claimed in claim 4, in which separation takes place between the surface of the plasma polymer separating layer and the surface of the wafer.

8. The method as claimed in claim 1, wherein the separating aid is a flexible plate.

9. The method as claimed in claim 8, wherein the first carrier is fixed on a holding means., and the flexible plate and the holding means each have at least one shaping and wherein the force acts between at least one shaping of the flexible plate and at least one shaping of the holding means.

10. The method as claimed in claim 8, wherein the separating aid is a plexiglass disk.

11. A device for carrying out the method as claimed in claim 1, comprising a holding means for fixing the first carrier and a holding means for fixing the second carrier, wherein the holding means for fixing the second carrier is designed as a separating aid and means for heating the layer system and/or for generating vibration of the layer system.

12. The method as claimed in claim 1. wherein the wafer has a thickness of ≤80 μm.

13. The method as claimed in claim 1, wherein said force is applied to a first end of the separating aid at a face of the separating aid facing the first carrier.

* * * * *